United States Patent
Hardin et al.

(10) Patent No.: US 10,418,497 B2
(45) Date of Patent: Sep. 17, 2019

(54) SILVER-BISMUTH NON-CONTACT METALLIZATION PASTES FOR SILICON SOLAR CELLS

(71) Applicant: Hitachi Chemical Co., Ltd., Tokyo (JP)

(72) Inventors: Brian E. Hardin, San Carlos, CA (US); Stephen T. Connor, San Francisco, CA (US); James Randy Groves, Sunnyvale, CA (US); Craig H. Peters, Belmont, CA (US)

(73) Assignee: Hitachi Chemical Co., Ltd., Tokyo (JP)

( * ) Notice: Subject to any disclaimer, the term of this patent is extended or adjusted under 35 U.S.C. 154(b) by 102 days.

(21) Appl. No.: 15/243,830

(22) Filed: Aug. 22, 2016

(65) Prior Publication Data

US 2017/0062632 A1   Mar. 2, 2017

Related U.S. Application Data

(60) Provisional application No. 62/377,369, filed on Aug. 19, 2016, provisional application No. 62/209,885, filed on Aug. 26, 2015.

(51) Int. Cl.
*H01L 31/00* (2006.01)
*H01L 31/0224* (2006.01)
*H01B 1/22* (2006.01)

(52) U.S. Cl.
CPC ....... *H01L 31/022425* (2013.01); *H01B 1/22* (2013.01); *Y02E 10/50* (2013.01)

(58) Field of Classification Search
CPC ....................................................... H01B 1/22
See application file for complete search history.

(56) References Cited

U.S. PATENT DOCUMENTS

| | | | | |
|---|---|---|---|---|
| 598,341 | A | * 2/1898 | Hammond | B23K 35/288 420/589 |
| 1,993,490 | A | * 3/1935 | Strasser | B23K 35/288 420/589 |
| 2,580,773 | A | 1/1952 | Heiman | |
| 2,662,831 | A | 12/1953 | R | |
| 2,852,366 | A | 9/1958 | Jenkins | |

(Continued)

FOREIGN PATENT DOCUMENTS

| | | |
|---|---|---|
| DE | 102011104396 A1 | 12/2012 |
| EP | 1732137 B1 | 10/2011 |

(Continued)

OTHER PUBLICATIONS

Translation of DE 10 2011 104 396.

(Continued)

*Primary Examiner* — Angelo Trivisonno
(74) *Attorney, Agent, or Firm* — R'Sue Popowich Caron

(57) ABSTRACT

Metallization pastes for use with semiconductor devices are disclosed. The pastes contain silver particles, low-melting-point base-metal particles, organic vehicle, and optional crystallizing agents. Specific formulations have been developed that produce stratified metal films that contain less silver than conventional pastes and that have high peel strengths. Such pastes can be used to make high contact resistance metallization layers on silicon.

15 Claims, 9 Drawing Sheets

(56) References Cited

U.S. PATENT DOCUMENTS

| | | |
|---|---|---|
| 3,489,657 A | 1/1970 | R et al. |
| 3,744,121 A | 7/1973 | Nagano et al. |
| 3,909,209 A | 9/1975 | Kruper et al. |
| 3,930,093 A | 12/1975 | Short |
| 3,949,118 A | 4/1976 | Nagano et al. |
| 4,001,146 A | 1/1977 | Horowitz |
| 4,045,245 A | 8/1977 | Coleman et al. |
| 4,122,232 A | 10/1978 | Kuo |
| 4,130,854 A | 12/1978 | Hertz |
| 4,137,361 A | 1/1979 | Deffeyes et al. |
| 4,347,165 A | 8/1982 | Matheson |
| 4,397,812 A | 8/1983 | Mallory |
| 4,485,153 A | 11/1984 | Janikowski et al. |
| 4,492,812 A | 1/1985 | Lindmayer |
| 4,635,701 A | 1/1987 | Sare et al. |
| 4,800,065 A | 1/1989 | Christodoulou et al. |
| 4,833,040 A | 5/1989 | Fishman |
| 4,873,148 A | 10/1989 | Kemp et al. |
| 5,118,362 A | 6/1992 | Angelo et al. |
| 5,162,062 A | 11/1992 | Carroll et al. |
| 5,178,685 A | 1/1993 | Borenstein et al. |
| 5,279,682 A | 1/1994 | Wald et al. |
| 5,320,684 A | 6/1994 | Amick et al. |
| 5,645,765 A | 7/1997 | Asada et al. |
| 5,714,238 A | 2/1998 | Komagata et al. |
| 5,840,432 A | 11/1998 | Hirai et al. |
| 6,059,952 A | 5/2000 | Kang et al. |
| 6,156,237 A | 12/2000 | Kubota et al. |
| 6,180,869 B1 | 1/2001 | Meier et al. |
| 6,262,359 B1 | 7/2001 | Meier et al. |
| 6,372,158 B1 | 4/2002 | Hashimoto et al. |
| 6,632,730 B1 | 10/2003 | Meier et al. |
| 6,710,239 B2 | 3/2004 | Tanaka |
| 6,770,369 B1 | 9/2004 | Oyamada |
| 7,384,447 B2 | 6/2008 | Kodas et al. |
| 7,470,416 B2 | 12/2008 | Ishida |
| 8,093,491 B2 | 1/2012 | Sridharan et al. |
| 8,597,397 B2 | 12/2013 | Kunze et al. |
| 8,610,289 B2 | 12/2013 | Wildpanner et al. |
| 8,696,946 B2 | 4/2014 | Matsumoto et al. |
| 8,697,476 B2 | 4/2014 | Borland |
| 8,748,327 B2 | 6/2014 | Park et al. |
| 8,884,277 B2 | 11/2014 | Neidert et al. |
| 9,275,772 B2 | 3/2016 | Pham et al. |
| 2004/0155227 A1 | 8/2004 | Bechtloff et al. |
| 2006/0022173 A1 | 2/2006 | Yamakawa et al. |
| 2006/0042681 A1 | 3/2006 | Korman |
| 2006/0289055 A1 | 12/2006 | Sridharan et al. |
| 2007/0056403 A1 | 3/2007 | Kubota |
| 2008/0143785 A1 | 6/2008 | Houjou |
| 2008/0230119 A1 | 9/2008 | Akimoto |
| 2009/0211626 A1 | 8/2009 | Akimoto |
| 2010/0120191 A1 | 5/2010 | Borden et al. |
| 2010/0163101 A1 | 7/2010 | Kumar et al. |
| 2010/0227433 A1 | 9/2010 | Konno |
| 2010/0243048 A1 | 9/2010 | Laudisio et al. |
| 2010/0269893 A1 | 10/2010 | Prince et al. |
| 2011/0192457 A1 | 8/2011 | Nakayama et al. |
| 2011/0197960 A1 | 8/2011 | Pham et al. |
| 2011/0223713 A1 | 9/2011 | Akimoto |
| 2011/0303898 A1 | 12/2011 | Tian et al. |
| 2011/0315217 A1 | 12/2011 | Gee |
| 2012/0082948 A1 | 4/2012 | Huh et al. |
| 2012/0085401 A1 | 4/2012 | Borland et al. |
| 2012/0279563 A1 | 11/2012 | Meier et al. |
| 2013/0098431 A1 | 4/2013 | Chen et al. |
| 2013/0248777 A1 | 9/2013 | Sgriccia et al. |
| 2013/0256606 A1 | 10/2013 | Matsumoto et al. |
| 2013/0270489 A1 | 10/2013 | Wang et al. |
| 2013/0277624 A1 | 10/2013 | Yang et al. |
| 2013/0284250 A1 | 10/2013 | Hang et al. |
| 2013/0319496 A1 | 12/2013 | Karpowich et al. |
| 2014/0020743 A1 | 1/2014 | Konno |
| 2014/0026953 A1 | 1/2014 | Zhang et al. |
| 2014/0048116 A1 | 2/2014 | Schulz et al. |
| 2014/0175340 A1 | 6/2014 | Choi et al. |
| 2014/0178671 A1 | 6/2014 | Dreezen et al. |
| 2014/0332071 A1 | 11/2014 | Jiang et al. |
| 2014/0374669 A1 | 12/2014 | Hardin et al. |
| 2015/0060742 A1 | 3/2015 | Glicksman et al. |
| 2015/0083213 A1 | 3/2015 | Hardin et al. |
| 2015/0203694 A1* | 7/2015 | Glicksman ............ H05K 1/095 252/514 |
| 2015/0243812 A1 | 8/2015 | Hardin et al. |
| 2015/0275062 A1 | 10/2015 | Kim et al. |
| 2016/0225926 A1 | 8/2016 | Schmitt et al. |

FOREIGN PATENT DOCUMENTS

| | | |
|---|---|---|
| TW | 201243865 | 11/2012 |
| WO | 2009032429 A1 | 3/2009 |
| WO | 2013036510 A1 | 3/2013 |
| WO | 2013090570 A1 | 6/2013 |
| WO | 2013158857 A1 | 10/2013 |
| WO | 2014174984 A1 | 10/2014 |
| WO | 2016099562 A1 | 6/2016 |

OTHER PUBLICATIONS

Zhu, "Coating different thickness nickel-boron nanolayers onto boron carbide particles," Surface & Coatings Technology 202 (2008) 2927-2934. (Available online Dec. 3, 2007).

A. Ebong, N. Chen, "Metallization of crystalline siione solar cells: A review", High Capacity Optical Networks and Enabling Technologies (HONET), 2012 9th International Conference on Dec. 12-14 pp. 102-109. DOI: 10.1109/HONET.2012.6421444.

Aihua Wang, "High Efficiency PERC and PERL Silicon Solar Cells," A thesis submitted to the University of New South Wales in fulfilment of the requirements for the degree of Doctor of Philosophy. Nov. 1992.

Chandrasekaran, "20% n-Type Silicon Solar Cell Fabricated by a Simple Process with an Aluminum Alloy Rear Junction and Extended Emitter," Presented at the 43rd IEEE Photovoltaic Specialists Conference, Jun. 5-10, 2016, Portland, OR.

D. L. Meier, E. A. Good, A. Garcia, B. L. Bingham, S. Yamanaka, V. Chandrasekaran, C. Bucher, "Determining components of series resistance from measurements on a finished cell", Proc. 4th World Conf. PVSEC, vol. 2, pp. 1315-1318, 2006. DOI: 10.1109/WCPEC. 2006.279656.

D. L. Meier, H. P. Davis, R. A. Garcia, J. A. Jessup, A. F. Carroll, "Self-doping contacts to silicon using silver coated with a dopant source." Proc. IEEE Photovoltaic Specialists Conf., pp. 69-74, 2000. DOI: 10.1109/PVSC.2000.915755.

Davis, K. O., et. al. "Manufacturing metrology for c—Si module reliability and durability Part II: cell manufacturing." Renewable and Sustainable Energy Reviews 59 (2016) 225-252. DOI: 10.1016/j.rser.2015.12.217.

F. Sirotti et al., Nickel-based air-firable thick-film conductors, Journal of Materials Science, 1990, pp. 4688-4693, vol. 25, USA.

Goodrich, A., et. al. "A wafer-based monocrystalline silicon photovoltaics road map: Utilizing known technology improvement opportunities for further reductions in manufacturing costs." Solar Energy Materials and Solar Cells 114 (Jul. 2013): 110-35. DOI: 10.1016/j.solmat.2013.01.030.

Halm, A., et. al., "The Zebra Cell Concept—Large Area n-Type Interdigitated Back Contact Solar Cells and One-Cell Modules Fabricated Using Standard Industrial Processing Equipment", Proc. the 27th EU Photovoltaic Specialists Conference, pp. 567-570, (2012). DOI: 10.4229/27thEUPVSEC2012-2AO.2.1.

International Search Report and Written Opinion of the International Searching Authority for PCT/US2014/043521, dated Dec. 23, 2014.

International Search Report for International application No. PCT/US14/43521.

K.Y. Lin et al., Synthesis of Invay alloy powders by electroless plating, Material Science and Engineering A, 2006, pp. 226-231, vol. 416, USA.

(56) References Cited

OTHER PUBLICATIONS

Karabacak, T., et. al. "Stress reduction in tungsten films usuing nanostructured compliant layers." J. Appl. Phys. 2004, 96 (10), 5740-5746. DOI: 10.1063/1.1803106.

Kholostov, K., et. al. "Electroplated nickel/tim solder pads for rear metallization of solar cells." IEEE J. Photovolt. 6 (2) 2016, p. 404-411. DOI: 10.1109/JPHOTOV.2015.2506408.

M. Amirjan et al., Preparation of tungsten base composite powder by electroless nickel plating, Powder Metallurgy, 2010, pp. 218-222, vol. 53, No. 3, USA.

N. Hedgecock et al., On the Structure and Electrical Properties of Electroless Ni—B Films, Journal of the Electrochemical Society, 1975, pp. 866-869, vol. 122, No. 7, USA.

P. Schmitt, D. Eberlein, C. Ebert, M. Tranitz, U. Eitner, H. Wirth. "Adhesion of Al-metallization in ultra-sonic soldering on the Al-rear side of solar cells." Energy Procedia, 38 (2013), pp. 380-386. DOI: 10.1016/j.egypro.2013.07.293.

PCT/US2014/071608 International Search Report and Written Opinion of the International Search Authority dated May 14, 2015.

Popovich, Vera (2013). "Microstructure and Mechanical Aspects of Multicrystalline Silicon Solar Cells" (Doctoral dissertation). (Retrieved from private correspondence).

Rauer, M. (2015). "Alloying from Screen-printed Aluminum Pastes for Silicon Solar Cell Applications" (Doctoral dissertation). (Retrieved from http://www.ub.uni-konstanz.de/a-z/d-e/dissertationen/)).

Saga, T. "Advances in crystalline silicon solar cell technology for industrial mass production." NPG Asia Mater. 2, 96-102 (2010). doi: 10.1038/asiamat.2010.82.

Schneller, E. J., et. al. "Manufacturing metrology for c—Si module reliability and durability Part III: module manufacturing." Renewable and Sustainable Energy Reviews 59 (2016) 992-1016. DOI: 10.1016/j.rser.2015.12.215.

Search Report for PCT/US/2014/071608, dated May 14, 2015.

Snowdon D., et. al. "Composite curved laminates for the UNSW sunswift II solar array." In: Proceedings of solar world congress; 2001.

Wang, A. (1992). "High efficiency PERC and PERL silicon solar cells" (Doctoral dissertation). (Retrieved from http://www.unsworks.unsw.edu.au).

WO2014174984_MachineTranslation.

International Search Report and Written Opinion for International application No. PCT/US16/48097 dated Dec. 28, 2016.

International Search Report for PCT/US2016/048098 dated Nov. 16, 2016.

\* cited by examiner

SILVER-BISMUTH NON-CONTACT METALLIZATION PASTES FOR SILICON SOLAR CELLS

CROSS-REFERENCE TO RELATED APPLICATIONS

This application claims priority to U.S. Provisional Patent Application 62/209,885, filed Aug. 26, 2015 and to U.S. Provisional Patent Application 62/377,369, filed Aug. 19, 2016, both of which are incorporated by reference herein.

STATEMENT OF GOVERNMENT SUPPORT

This invention is made with Government support under contract number IIP-1430721 awarded by the NSF. The Government may have certain rights in this invention.

BACKGROUND OF THE INVENTION

Field of the Invention

This invention relates to conductive metallization pastes, and more specifically to metallization layers that have a high peel strength after co-firing and subsequent soldering to a tabbing ribbon. Such pastes may be especially well-suited for use in silicon based solar cells.

In general, conductive metallization pastes contain silver particles, glass frit, and an organic binder, all mixed with an organic vehicle. The price of silver particles represents more than 80% of the materials cost of many conductive metallization pastes, especially those used for front side and rear tabbing solar cell applications. Reducing the amount of silver in the paste is highly desirable and is done either by reducing the overall paste solids content or by replacing silver with other particles to reduce the silver fraction in the paste.

State-of-the-art commercial rear tabbing pastes contain organic solvents and binder along with 40-55 wt % silver and 5-8 wt % glass frit. When the total solids content of the paste is reduced, the overall fired film thickness decreases. This strategy has been successfully employed over the last five years in the rear tabbing layer for PV (photovoltaic) cells, reducing the fired silver film thickness from 7 μm to 3 μm. Such pastes result in films where the Ag content is 83-90 wt % of the dried film. Unfortunately, further reduction of the fired film thickness can lead to increased film porosity, incomplete Ag coverage on the silicon surface, and solder leaching, all of which reduce the overall peel strength of the tabbed solder joint.

In the past, adding a large quantity of non-precious metal, inorganic particles to Ag based metallization pastes has proven challenging for several reasons. Adding large quantities of particles that contain non-precious metal, inorganic materials such as aluminum that alloy with silver at high temperatures can form dense, strong films, but the resulting alloy may be unsolderable, resulting in a soldered joint with an unacceptable low (e.g., less than 1 N/mm) peel strength. Particles made from non-precious metal, inorganic materials such as nickel, that are not miscible with silver may produce mixed Ag/inorganic films that retain solderability at high firing temperatures. However, silver does not wet such materials during firing, which can cause de-sintering around the inorganic particles and result in phase-separated films that may be homogenous but may also be highly porous and structurally weak. Furthermore, adding large quantities of base-metal particles can negatively impact the contact resistance between the tabbing layer and aluminum layer, causing an increase in the overall series resistance of the solar cell.

There is a need to develop metallization pastes that contain inorganic materials to reduce their silver content. It would be especially useful if such pastes produced fired films with high peel strengths and long-term joint reliability while maintaining similar or better electrical performance than films fade from conventional silver metallization pastes.

BRIEF DESCRIPTION OF THE DRAWINGS

The foregoing aspects and others will be readily appreciated by the skilled artisan from the following description of illustrative embodiments when read in conjunction with the accompanying drawings.

SUMMARY

Figure 1:
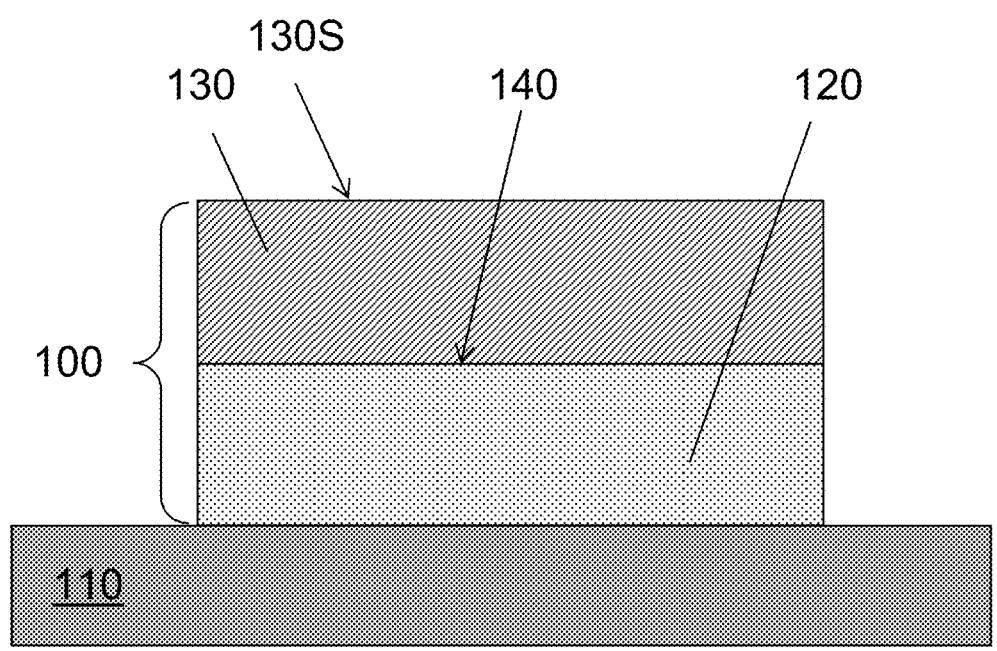
FIG. 1 is a schematic cross-section drawing of a stratified film 100 made from co-firing metallization pastes on a silicon substrate, according to an embodiment of the invention.

In one embodiment of the invention, a solar cell is disclosed. The solar cell has a silicon substrate, a plurality of fine grid lines on the front surface of the silicon substrate, at least one front busbar layer in electrical contact with at least a portion of the plurality of fine grid lines, an aluminum layer on a portion of the back surface of the silicon substrate, and at least one rear tabbing layer on a portion of the back surface of the silicon substrate. In one arrangement, the rear tabbing layer is a stratified film that has at least two sublayers: a first low-melting-point base-metal sublayer over the silicon substrate, and a second silver-rich sublayer over the first sublayer. The second sublayer may have an exterior surface that is exposed to the outside environment. The stratified film has a low-temperature, base-metal fraction greater than 20%. Some edges of the aluminum layer may overlap with some edges of the rear tabbing to form overlap regions. The overlap regions may contain a solid aluminum-silicon eutectic layer in the underlying silicon layer, a modified rear tabbing layer over the solid aluminum-silicon eutectic layer, and an aluminum layer over the modified rear tabbing layer. The stratified film may also contain $(MO_x)_y(SiO_2)_z$, crystallites wherein $0 \leq x \leq 3$, $1 \leq y \leq 10$, and $0 \leq z \leq 1$, and M is any of bismuth, tin, tellurium, antimony, lead, silicon, or alloys, composites, or combinations thereof.

The first sublayer may contain a material such as bismuth, aluminum, carbon, tin, tellurium, antimony, lead, silicon, or alloys, oxides, composites, or combinations thereof. The first low-melting-point base-metal sublayer may contain bismuth and oxygen.

The stratified film may contain at least 0.5 wt % aluminum. The stratified film may have a low-temperature, base-metal fraction greater than 30%, greater than 40%, or greater than 50%.

The aluminum layer may have a thickness between 20 μm and 30 μm.

The stratified film may have a thickness between 1 μm and 15 μm, between 1 μm and 10 μm, or between 1 μm and 3 μm. The first sublayer may have a thickness between 0.01 μm and 5 μm. The first sublayer may have a thickness between 0.25 μm and 3 μm, or between 0.5 μm and 2 μm. The solar cell of Claim 1, wherein the second sublayer may have a thickness between 0.5 μm and 10 μm, between 0.5 μm and 5 μm, or between 1 μm and 4 μm.

The solar cell of Claim 1, wherein the second sublayer exterior surface may contain at least 90 wt %, at least 80 wt %, or at least 70 wt % silver.

The aluminum layer in the overlap region may have an exterior surface that is exposed to the outside environment. The modified rear tabbing layer in the overlap region may have an exterior surface that is exposed to the outside environment. The overlap region may be between 10 μm and 500 μm or 100 μm and 300 μm wide.

The modified rear tabbing layer may contain any of bismuth, tin, tellurium, antimony, lead, silicon, oxides or alloys, composites, or combinations thereof. The modified rear tabbing layer may contain at least 0.5 wt % or at least 1 wt % aluminum.

The stratified film may have a conductivity that is 2 to 50 times, 2 to 25 times, or 2 to 10 times less than the conductivity of bulk silver. T The rear tabbing layers may have a peel strength of more than 1 N/mm when soldered to tin-coated copper tabbing ribbons.

The contact resistance between the rear tabbing layer and the aluminum layer may be between 0 and 5 mΩ, between 0.25 and 3 mΩ, or between 0.3 and 1 mΩ.

The rear surface of the silicon substrate may have a doped silicon base layer, and the rear tabbing layers make electrical contact to the silicon base layer with a contact resistance greater than 100 mΩ-cm2.

The silicon substrate may contain be a monocrystalline or a multi-crystalline silicon wafer and may have an n-type base or a p-type base.

In another embodiment of the invention, a metallization paste is disclosed. The metallization paste contains silver particles low-melting-point, base-metal particles, optionally a crystallizing agent and aluminum-based particles, which are all mixed together in an organic vehicle. The low-temperature, base-metal fraction in the metallization paste is greater than 20%, greater than 30%, greater than 40%, or greater than 50%. The metallization paste may contain a crystallizing agent. The metallization paste may have a solids loading between 30 wt % and 70 wt %. The metallization paste may contain between 10 wt % and 45 wt % silver particles. The metallization paste may contain between 5 wt % and 35 wt % low-melting-point, base-metal particles. The metallization paste may contain between 0.5 wt % and 3 wt % aluminum particles. The metallization paste may also contain less than 2 wt % strong glass-forming frits.

The silver particles may be spherically shaped nanoparticles with a D50 between 10 nm and 1 μm, between 50 nm and 800 nm, or between 200 nm and 500 nm. The silver particles may be spherically shaped micron-sized particles with a D50 between 1 μm and 10 μm, between 1 μm and 5 μm, or between 1 μm and 2 μm. The silver particles may be flake shaped particles with a width between 1 and 10 μm and a thickness between 100 nm and 500 nm. The silver particles may be a mixture of nanoparticles and micron sized particles. The silver particles may be a mix of 50 wt % nanoparticles with a D50 of 500 nm, 30 wt % spherical micron sized particles with a D50 of 2 μm, and 20 wt % silver flakes with diameter of 2 μm. The silver particles may have either a unimodal or a bimodal size distribution.

The low-melting-point, base-metal particles may contain any of bismuth (Bi), tin (Sn), tellurium (Te), antimony (Sb), lead (Pb), or alloys, composites, or other combinations thereof. The low-melting-point, base-metal particles may contain bismuth. The metallization low-melting-point, base-metal particles may be crystalline. The low-melting-point, base-metal particles may have a spherical shape with a D50 between 50 nm and 5 μm, between 300 nm and 5 μm, or between 300 nm and 2 μm. The low-melting-point, base-metal particles may have either a unimodal or a bimodal size distribution.

The low-melting-point, base-metal particles may have bismuth cores and each bismuth core is coated by a shell. The shell may contain any of silver (Ag), nickel (Ni), nickel-boron (Ni:B) alloy, tin (Sn), tellurium (Te), antimony (Sb), lead (Pb), molybdenum (Mo), titanium (Ti), magnesium (Mg), boron (B), silicon oxides (SiOx), composites, or other combinations thereof. The shell may contain silver with a thickness is less than 200 nm. The shell may contain a nickel-boron alloy with a boron content between 2-8 wt %.

The aluminum-based particles may have a spherical shape with a D50 between 50 nm and 15 μm, between 300 nm and 10 μm, or between 300 nm and 4 μm. The aluminum-based particles may have either a unimodal or a bimodal size distribution. The metallization paste may contain 35 wt % silver particles, 16 wt % low melting point base-metal particles, 1 wt % aluminum-based particles, 48 wt % organic vehicle, no crystallizing agent, and no glass frit.

The metallization paste may have a viscosity between 10,000 and 200,000 cP at 25° C. and at a sheer rate of 4 sec−1.

The metallization paste may also contain a crystallizing agent mixed together with the silver particles, the low-melting-point base-metal particles, and the aluminum-based particles in the organic vehicle. The metallization paste may contain less than 1 wt % or less than 0.1 wt % crystallizing agent. The crystallizing agent may contain any of tellurium, silicon, boron, zinc, or oxides or alloys thereof. The crystallizing agent may contain tellurium and/or tellurium oxide. The crystallizing agent may contain particles with an approximately spherical shape and a D50 between 50 nm and 5 μm, between 100 nm and 3 μm, or between 200 nm and 1 μm. The crystallizing agent may contain flake particles with diameters between 1 and 10 μm and thicknesses between 100 nm and 500 nm.

In another embodiment of the invention, an overlap region on the back side of a silicon solar cell is disclosed. The overlap region contains a solid aluminum-silicon eutectic region that extends into the back side of the silicon solar cell, a modified rear tabbing layer over the solid aluminum-silicon eutectic region, and an aluminum layer over the modified rear tabbing layer. The modified rear tabbing layer may contain any of bismuth, tin, tellurium, antimony, lead, silicon, or alloys, composites, or combinations thereof. The low-melting-point base-metal fraction greater than 20%.

DETAILED DESCRIPTION

The preferred embodiments are illustrated in the context of metallization layers for silicon-based solar cells. The skilled artisan will readily appreciate, however, that the materials and methods disclosed herein will have application in a number of other contexts where making good electrical contact to semiconducting or conducting materials is desirable, particularly where good adhesion and low cost are important. These and other objects and advantages of the present invention will become more fully apparent from the following description taken in conjunction with the accompanying drawings. All publications referred to herein are incorporated by reference in their entirety for all purposes as if fully set forth herein.

Metallization pastes are formulated to be applied onto substrates, such as solar cells, using a process such as screen printing. The pastes are dried and then co-fired in an oxidizing ambient to compact the solid components and vaporize and oxidize organic molecules in order to produce compact films. For the purposes of this disclosure, the term "co-fired" is used to describe heating to between 700° C. and 850° C. for about 0.5 to 3 seconds in ambient air conditions using an IR belt furnace or similar tool. The temperature profile of the substrate is often calibrated using a DataPaq® system with a thermocouple attached to a bare substrate.

Metrics for such films include:
solderability
peel strength,
bulk resistance,
contact resistance between the rear tabbing layer and the aluminum layer, and
contact resistance between the metallization layer and the substrate.

Solderability is the ability to form a strong physical bond between two metal surfaces by the flow of a molten metal solder between them at temperatures below 400° C. Soldering on a solar cell may be performed after heating the cell in air to over 650° C. for approximately one second. Soldering involves the use of flux, which is a chemical agent that cleans or etches one or both of the surfaces prior to reflow of the molten solder. This can be difficult because many metal oxides are resistant to commonly-used fluxes after oxidation above 650° C.

For layers that contact a tabbing ribbon directly, it is useful if the peel strength is greater than 1 N/mm (Newton per millimeter). The peel strength can be described as the force required to peel a soldered ribbon, at a 180° angle from the soldering direction, divided by the width of the soldered ribbon. It is common for the peel strength between rear tabbing layers and the solar cell to be between 1.5 and 4 N/mm. Peel strength is a metric of solder joint strength for solar cells and is an indicator of module reliability.

Meier et al. describes how to use a four-point probe electrical measurement to determine the resistivity of each metallization layer on a completed solar cell (Reference: Meier et al. "Determining components of series resistance from measurements on a finished cell", IEEE (2006) pp 1315). The bulk resistance of a metallization layer is directly related to the bulk resistance of the material from which it is made. As an example, the bulk resistance of pure Ag is 1.6E-8 Ω-m. However, because of the structural imperfections and impurities, Ag metallization layers used on industrial solar cells can have a bulk resistance that is 1.5 times to 5 times higher than the bulk resistance of pure Ag. A low bulk resistance is especially important for fine grid lines, which must transport current over a relatively long (i.e., more than 1 cm) length.

In a solar cell current will flow from an aluminum layer on the back side and through a rear tabbing (or metallization) layer. The contact resistance between the rear tabbing layer and the aluminum layer in the solar cell can be measured by using the transmission line measurement (TLM) (Reference: Meier et al. "Cu Backside Busbar Tape: Eliminating Ag and Enabling Full Al coverage in Crystalline Silicon Solar Cells and Modules", IEEE PVSC (2015) pp. 1-6). The TLM is plotted as resistance versus distance between electrodes. In the experimental set-up the rear tabbing layer is printed directly onto a silicon wafer and then dried. An aluminum layer is subsequently printed partially over the silver layer with an overlap region of approximately 300 μm surrounding all sides of the tabbing layer. The wafer is subsequently dried and eventually co-fired. The contact resistance between the rear tabbing layer and the aluminum layer is half of the y-intercept value of a linear fit of the resistance versus distance TLM plot. The electrical resistance between busbars can be measured using a Keithley 2410 Sourcemeter in a four-point probe setup that sourced current between −0.5 A and +0.5 A and measured the voltage. In various embodiments, the contact resistance between the rear tabbing layer and the aluminum layer is between 0 and 5 mΩ, 0.25 and 3 mΩ, 0.3 and 1 mΩ, or any range subsumed therein. The sheet resistance of the aluminum layer is determined by the slope of the line times the length of the electrodes. The contact resistance and sheet resistance can be used to numerically determine the transfer length and subsequently the contact resistivity.

The contact resistance between a metallization layer and an underlying silicon wafer has an impact on the power conversion efficiency of a solar cell. The contact resistance can be measured on silicon substrates by using the TLM described above. For fine grid lines on the front side of a silicon wafer, it is useful to reduce the contact resistance to less than 30 mΩ-cm$^2$ or less than 10 mΩ-cm$^2$ to maintain a high fill factor. For the rear tabbing and front busbar layers the contact resistance can be higher than for the fine grid lines and still not affect device performance because most of the current is extracted from the wafer through the fine grid lines on the front side and the aluminum layer on the rear side. Furthermore, there can be a large contact resistance between a silver metallization layer and a silicon substrate because silver does not make ohmic contact to non-degenerately doped, p-type silicon. Furthermore, such a contact resistance tends to increase when a large quantity of base metal particles are substituted for silver particles in the metallization paste. In some embodiments, the contact resistance between the stratified film and the silicon wafer is greater than 100 mΩ-cm$^2$, or greater than 1 Ω-cm$^2$, or greater than 10 Ω-cm$^2$.

Ag-LowT$_M$BM Metallization Paste Components

This disclosure describes pastes made of silver and low-melting-point, base metal particles (LowT$_M$BMs) metallization pastes (Ag-LowT$_M$BM pastes). The Ag-LowT$_M$BM pastes contain silver particles, LowT$_M$BM particles, aluminum based particles, and an organic vehicle. Such pastes may also contain crystallizing agent(s) and small amounts of strong glass-forming frits. The term "solids loading" is often used in connection with metallization pastes to mean the amount or proportion of inorganic solids in a metallization paste. In an exemplary embodiment, Ag-LowT$_M$BM metallization paste has a solids loading that includes silver particles, low-melting-point base-metal particles, aluminum-based particles, no crystallizing agent and no strong glass-forming frits. All metallization pastes described herein also include an organic vehicle, although that may not always be stated explicitly.

D50 is a common metric that is used to describe the median diameter of particles. The D50 value is defined as the median value at which half of the particle population has a diameter below and half the particle population has a diameter above the value. Measuring a particle diameter distribution is typically performed with a laser particle size analyzer such as the Horiba LA-300. Spherical particles are dispersed in a solvent in which they are well separated and the scattering of transmitted light is directly correlated to the size distribution from smallest to largest dimensions. A common approach to express laser diffraction results is to report the D50 values based on volume distributions. It should be understood that the term "spherical shape" is used herein to mean an approximately spherical or equiaxed shape. Particles do not generally have perfect spherical shapes. It is also possible to measure the D50 and particle size distribution of particles using a scanning electron microscope and image processing software such as ImageJ.

In one arrangement, the silver particles in the metallization paste are spherically shaped, nanoparticles with a D50 between 10 nm and 1 µm, or between 50 nm and 800 nm, or between 200 nm and 500 nm, or any range subsumed therein. In another arrangement, the silver particles in the metallization paste are spherically shaped, micron-sized particle with a D50 between 1 µm and 10 µm, or between 1 µm and 5 µm, or between 1 µm and 2 µm, or any range subsumed therein. In another arrangement, silver particles have flake, dendrite, or filament shapes. In an exemplary embodiment, the silver particles are flakes with a width between 1 and 10 µm and a thickness between 100 nm and 500 nm. A silver filament may have a diameter between 200 nm and 1000 nm and a length greater than 1 µm. In an exemplary embodiment, the silver particles have a unimodal size distribution. In another exemplary embodiment, the silver particles have a bimodal particle size distribution. In general, silver particles can include a mixture of spherical nanoparticles, spherical micron-sized particles, flakes, dendrites and/or filaments. In an exemplary embodiment, the silver particles contain a mixture of nanoparticles and micron sized particles. In one embodiment, the silver particles contain 50 wt % spherical nanoparticles with a D50 of 500 nm, 30 wt % spherical micron sized particles with a D50 of 2 µm, and 20 wt % silver flakes with a diameter of 2 µm.

The term "low-melting-point, base-metal" (LowT$_M$BM) particle is used herein to describe any base-metal-containing or base-metal alloy particle that has a melting point below 400° C., below 350° C., or below 300° C. In an exemplary embodiment the LowT$_M$BMs have a solubility in silver of less than 20 wt % or less than 10 wt % at 850° C. In one embodiment of the invention, LowT$_M$BMs contain bismuth (Bi), tin (Sn), tellurium (Te), antimony (Sb), lead (Pb), or alloys, composites, or other combinations thereof. In one arrangement, the LowT$_M$BMs are primarily crystalline and metallic. In one arrangement, the LowT$_M$BM particles have a spherical shape with a D50 between 50 nm and 5 µm, between 300 nm and 5 µm, or between 300 nm and 2 µm. In an exemplary embodiment, the LowT$_M$BM particles have a unimodal size distribution. In an exemplary embodiment, the LowT$_M$BM particles have a bimodal particle size distribution. In another arrangement, the LowT$_M$BM particles have a flake, dendrite, or filament shape. The flake may have a diameter between 1 µm and 10 µm and a thickness between 100 nm and 500 nm. The filament may have a diameter between 200 µm and 1000 nm and a length greater than 1 µm. In an exemplary embodiment the LowT$_M$BM particles have a D50 of 2 µm.

In other embodiments, a low-melting-point, base-metal particle has a core-shell morphology; a LowT$_M$BM core particle is coated with a thin shell. In some arrangements, the coat completely encapsulates the core particle. In other arrangement, the coat only partially encapsulates the core particle. In one embodiment, a core-shell LowT$_M$BM particle has a LowT$_M$BM core and a first shell coating the core. The first shell may contain nickel, boron, silver, gold, platinum, copper, indium, tin, zinc, lead, bismuth, antimony, or alloys or combinations thereof. The first shell may have a uniform thickness or the thickness of the shell may vary. In various embodiments, on average, the first shell is less than 1000 nm thick, less than 500 nm thick, less than 200 nm thick, less than 50 nm thick or any range subsumed therein. In an exemplary embodiment, the core-shell LowT$_M$BM particle has a metallic bismuth core and a first silver shell that is 200 nm thick. In another embodiment, a core-shell LowT$_M$BM particle has a metallic bismuth core and a nickel-boron alloy (2-8 wt % B) first shell.

Glass frits are glassy oxides of silicon or boron and one or more additional elements such as barium, bismuth, lead, zinc, tellurium, aluminum, strontium, sodium, lithium, or other trace heavy metals. When used in conventional silver metallization pastes, the composition of the frit is chosen to provide optimal melting and flow properties for sintering of the silver metal particles at temperatures between 400° C. and 900° C. Commercially available glass frit (e.g., Ceradyne product #V2079) and other additives can be used in front side metallization pastes to penetrate through anti-reflective coatings, improve silver sintering, and make ohmic contact to the silicon wafer.

The reactivity of a glass frit during co-firing determines, at least partially, whether it will assist in crystallization or impede crystallization. Strong glass-forming frits may contain, in oxide and alloy forms, bismuth (Bi), lead (Pb), silicon (Si), and sodium (Na). Such strong glass-forming frits can readily solubilize metals into amorphous networks. Many glass frits commonly used in PV metallization pastes are strong glass-forming frits. Strong glass-forming frits can increase the oxidation of LowT$_M$BM making them much less effective in metallization paste. A film formed from a metallization paste that contains strong glass-forming frits, silver particles, and LowT$_M$BM may have poor solderability with solder-coated ribbons and may also have a brittle internal structure due to the large volume of glassy material when co-fired under conditions typically used for aluminum back surface field (BSF) solar cells. In Ag-LowT$_M$BM metallization pastes, strong glass forming frits, such as those containing, in oxide and alloy forms, mainly bismuth (Bi), lead (Pb), silicon (Si), sodium (Na), and boron (B) are used sparingly in order to prevent oxidation of LowT$_M$BMs. In one arrangement, such a metallization paste contains less than 2 wt % strong glass-forming frits.

Weak glass-forming frits, which may contain, in oxide and alloy forms, tellurium (Te), silicon (Si), boron (B), aluminum (Al), or zinc (Zn). Such weak glass-forming frits solubilize metals into amorphous networks only minimally. In some arrangements, films formed from metallization pastes that contain such weak glass-forming frit material show partial formation of crystalline phases within a glassy phase. Such films have good high temperature solderability and strong peel strengths.

The term "crystallizing agent" is used herein to describe a material that reacts with LowT$_M$BMs during co-firing to assist in formation of crystals in a LowT$_M$BM sublayer. Crystallizing agents may also improve the adhesion and subsequent peel strength of co-fired Ag:LowT$_M$BMs layers. The crystallizing agent may be in the form of particles. In one embodiment, crystallizing agents are a specific subgroup of glass frits that contain tellurium (Te), silicon (Si), boron (B), aluminum (Al), zinc (Zn), or alloys, oxides, composites, or other combinations thereof. It is common to add crystallizing agents to boron-oxide-containing or silicon-oxide-containing glasses. In another embodiment, a crystallizing agent contains metals or metallic alloys of tellurium (Te), silicon (Si), boron (B), or zinc (Zn), composites, or other combinations thereof. In an exemplary embodiment, a crystallizing agent contains tellurium. In an exemplary embodiment, a crystallizing agent contains tellurium oxide. In one arrangement, the crystallizing agent is a particle with a spherical shape and a D50 between 50 nm and 5 µm, between 100 nm and 3 µm, between 200 nm and 1 µm, or any range subsumed therein. In another arrangement, the crystallizing agent has a flake, dendrite, or filament shape. The flake may have a diameter between 1 and 10 µm and a thickness between 100 nm and 500 nm. In one exemplary embodiment, crystallizing agent particles have a unimodal size distribution. In another exemplary embodiment, crystallizing agent particles have a bimodal particle size distribution.

In one embodiment of the invention, the organic vehicle is a mixture of organic solvents and binders. Other additives may also be included in the organic vehicle. The viscosity of metallization pastes can be tuned by adjusting the amounts of binders and solvents in the organic vehicle and by including thixotropic agents. In one arrangement, the metallization paste has a viscosity between 10,000 and 200,000 cP at 25° C. and at a sheer rate of 4 sec$^{-1}$ as measured using a temperature controlled Brookfield DV-II Pro viscometer. Common solvents include terpineol and glycol ethers (diethylene glycol monobutyl ether, triethylene glycol monobutyl ether, and texanol). Common organic binders include ethyl cellulose, carboxymethyl cellulose, poly(vinyl alcohol), poly(vinyl butyral), and poly(vinyl pyrrolidinone).

Aluminum-based particles may be added to a Ag:Bi metallization paste in order to reduce contact resistance between rear tabbing and aluminum layers. In an exemplary embodiment, aluminum-based metal particles are made of metallic aluminum (Al). In one embodiment aluminum-based particles are crystalline. In one arrangement, aluminum-based particles have a spherical shape with a D50 between 50 nm and 15 µm, between 300 nm and 10 µm, or between 300 nm and 4 µm. In an exemplary embodiment, aluminum-based particles have a unimodal size distribution. In an exemplary embodiment, aluminum-based particles have a bimodal particle size distribution. In some arrangements, aluminum-based particles have flake, dendrite, or filament shapes. The flake may have a diameter between 1 µm and 10 µm and a thickness between 100 nm and 500 nm. The filament may have a diameter between 200 µm and 1000 nm and a length greater than 1 µm.

In one embodiment of the invention, LowT$_M$BM metallization pastes and films also contain additional materials that can getter oxygen or increase their shelf lives (e.g., Staybelite™). In an exemplary embodiment, semiconducting particles such as silicon are added to a bismuth-containing metallization paste so that bismuth silicate crystals are formed during co-firing in the LowT$_M$BM layer formed from such a paste, increasing the degree of crystallinity in the LowT$_M$BM layer.

In one embodiment of the invention, at least some silver particle in a metallization paste are replaced by LowT$_M$BMs. Such pastes can be referred to as Ag:LowT$_M$BMs pastes. Crystallizing agents can improve the adhesion and peel strength of films made from co-fired Ag:LowT$_M$BMs pastes.

Ag-LowT$_M$BM Paste Formulations for Specific Metallization Layers

The low-melting-point base-metal fraction is a useful metric that can be used to describe the LowT$_M$BM content in pastes and films. The low-melting-point base-metal fraction is determined by dividing the weight of the LowT$_M$BM by the entire metal weight in the metallization paste. As an example, if a paste contains 3.5 g of Ag and 2 g of bismuth, which is the LowT$_M$BM, and 0.1 g of aluminum based particles, then the low-melting-point base-metal fraction in the paste is 35.7% and is calculated using the equation below:

$$LowT_mBP\ Metal\ Fraction = \frac{2\ g\ Bi}{2\ g\ Bi + 3.5\ g\ Ag + 0.1\ g\ Al} * 100\% = 35.7\%$$

In exemplary embodiments, the metallization paste has a low-melting-point base-metal fraction greater than 20%, greater than 30%, greater than 40%, or greater than 50%.

Examples of formulations for rear tabbing and front busbar pastes that contain silver particles, LowT$_M$BMs, aluminum based particles and crystallizing agents are shown in Table I. In one embodiment of the invention, a Ag-LowT$_M$BMs metallization paste has a solids loading between 30 wt % and 70 wt %. In one embodiment, the metallization paste has between 10 wt % and 45 wt % silver particles. In one embodiment, the metallization paste has between 5 wt % and 35 wt % LowT$_M$BM particles. A small quantity of aluminum-based particles can be included in the paste to reduce contact resistance between a rear tabbing and an aluminum layer. In another embodiment, the metallization paste has between 0.5 wt % and 3 wt % aluminum based particles. Crystallizing agents are typically added when it is desirable to increase the peel strength of the rear tabbing layer or front busbar layer. In various embodiments, a crystallizing agent accounts for less than 1 wt %, less than 0.5 wt %, or less than 0.1 wt % of the paste. In one embodiment, a metallization paste also contains less than 2 wt %, less than 1 wt %, or 0 wt % strong glass-forming frits.

TABLE I

Silver/LowT$_M$BMs/Crystallization Agent Metallization Paste Formulations (wt %)

| Paste Use (lines) | Silver particles | LowT$_M$BMs | Crystallizing Agent | Aluminum-based particles | Organic Vehicle |
|---|---|---|---|---|---|
| Rear Tabbing (I) | 10-45 | 5-35 | 0.1-3 | 0 | 30-70 |
| Rear Tabbing (II) | 10-45 | 5-35 | 0-3 | 0.5-3 | 30-70 |
| Front Busbar | 10-45 | 3-35 | 0.1-3 | 0-3 | 30-70 |

Metallization paste formulation can be adjusted to achieve a desired bulk resistance, contact resistance, film thickness, and/or peel strength for a particular metallization layer. In an exemplary embodiment, the metallization paste contains 35 wt % Ag particles, 16 wt % metallic bismuth particles (LowT$_M$BMs), 1 wt % aluminum-based particles, no glass frit, no crystallizing agent and 48 wt % organic vehicle. In another embodiment, the metallization paste contains 35 wt % Ag particles, 16 wt % metallic bismuth particles (LowT$_M$ BMs), 0.07 wt % TeO$_2$ (crystallizing agent), no glass frit, no aluminum-based particles and 48.93 wt % organic vehicle.

Stratified Metallization Film made from Ag-LowT$_M$BM Pastes

Scanning electron microscopy (SEM) and energy dispersive x-ray spectroscopy (EDX) (referred to collectively as SEM/EDX) as used herein were performed using a Zeiss Gemini Ultra-55 analytical field emission scanning electron microscope, equipped with a Bruker XFlash® 6|60 detector. Details about operating conditions are described for each analysis. Cross-sectional SEM images of the co-fired multilayer film stack were prepared by ion milling. Samples are prepared by applying a thin epoxy layer to the top of the co-fired multilayer stack and dried for at least 30 minutes. The sample was then transferred to a JEOL IB-03010CP ion mill operating at 5 kV and 120 uA for 8 hours to remove 80 microns from the sample edge. Milled samples were stored in a nitrogen box prior to SEM/EDX.

FIG. 1 is a schematic cross-section drawing of a stratified film 100 that was formed during co-firing a Ag: LowT$_M$BM paste on a silicon substrate 110. It should be noted that the figure is not drawn to scale. During co-firing, at least a portion of the silver particles and LowT$_M$BM particles in the Ag:LowT$_M$BM paste phase separate from each other. The LowT$_M$BM particles may melt and collect, forming a LowT$_M$ BM sublayer 120 adjacent to the silicon substrate 110. The silver particles may sinter or melt, forming a silver-rich sublayer 130 over the LowT$_M$BM sublayer 120. An outside surface 130S of the silver-rich sublayer 130 is exposed to the outside environment. In one embodiment, the LowT$_M$BM sublayer 120 contains bismuth, aluminum, carbon, tin, tellurium, antimony, lead, silicon, or alloys, oxides, composites, or combinations thereof. In an exemplary embodiment, the LowT$_M$BM sublayer 120 contains bismuth and oxygen (oxidized bismuth). In one arrangement, elements such as oxygen, aluminum, silicon, and/or carbon that are incorporated into the LowT$_M$BM sublayer 120 during co-firing.

The silver-rich sublayer 130 contains mostly silver. The outermost surface 130S of the silver-rich sublayer is easily soldered as it is also silver-rich. Plan view EDX was used to determine the concentration of elements on the outermost surface 130S of the silver-rich sublayer 130. SEM/EDX was performed with the equipment described above and at an accelerating voltage of 10 kV with a 7 mm sample working distance and 500 times magnification. In various embodiments, at least 70 wt %, at least 80 wt %, or at least 90 wt % of the outside surface 130S of the metallization layer is silver. An interface 140 between the LowT$_M$BM sublayer 120 and the silver-rich sublayer 130 may not be as sharply defined as shown in FIG. 1. In some arrangements, there may be some intermixing of the LowT$_M$BM sublayer 120 and the silver-rich sublayer 130 layers at the interface 140.

The thicknesses of the stratified film 100, the LowT$_M$BM sublayer 120 and the silver-rich sublayer 130 can be measured using cross-sectional SEM/EDX of the stratified film. In some embodiments, the total thickness of the stratified film 100 varies between 1 μm and 15 μm, between 1 μm and 10 μm, between 1 μm and 3 μm, or any range subsumed therein. In some embodiments, the silver-rich sublayer 130 has a thickness between 0.5 μm and 10 μm, between 0.5 μm and 5 μm, between 1 μm and 4 μm, or any range subsumed therein. In some embodiments, the LowT$_M$BM sublayer 120 has a thickness between 0.01 μm and 5 μm, between 0.25 μm and 5 μm, between 0.5 μm and 2 μm, or any range subsumed therein.

The low-melting-point base-metal fraction in the stratified film 100 can be determined by Energy Dispersive X-Ray Spectroscopy (EDX). EDX can be used to measure the ratio of Ag to Bi even if the bismuth is in a crystalline or oxidized state. The EDX data was collected for approximately three minutes using the equipment described above at an accelerating voltage of 20 kV, and a working distance of 7 mm over the entire image shown in FIG. 4. Elemental quantification was performed on the spectra using Bruker Quantax Esprit 2.0 software for automatic elemental identification, background subtraction, and peak fitting. Only the metal peaks, which were exclusively silver and bismuth, quantified from the EDX spectrum to determine the low-melting-point base-metal fraction in the film. In an exemplary embodiment, the stratified film has a low temperature base-metal fraction greater than 20 wt %, or greater than 30%, or greater than 40% or greater than 50%.

In the past, it was challenging to increase the low-melting-point base-metal fraction in a silver-based metallization paste beyond 16 wt % with materials such as bismuth because of Bi oxidation during heating. In one embodiment, the addition of the crystallizing agent and/or the aluminum-based particles reduces oxidation, allowing an increase in the LowT$_M$BMs metal fraction beyond 20 wt %. In another embodiment, the reduction of glass frits to less than 3 wt % can reduce oxidation of the LowT$_M$BM during co-firing, which improves solderability.

A crystallizing agent may help the LowT$_M$BM to form crystalline compounds with silicon and oxygen during co-firing. Such crystalline compounds can improve adhesion between the LowT$_M$BM sublayer 120 and the silicon surface 110. In one embodiment of the invention, the stratified film 100 contains (MO$_x$)$_y$(SiO$_2$)$_z$, crystallites, wherein 0≤x≤3, 1≤y≤10, and 0≤z≤1. M may be any of bismuth (Bi), tin (Sn), tellurium (Te), antimony (Sb), lead (Pb), and mixtures thereof. Such crystalline compounds may be distributed throughout the film either homogeneously or heterogeneously in a stratified manner and may account for 0.1-20 wt %, 0.5-10 wt %, 1-5 wt % (or any range subsumed therein) of the co-fired film. In one embodiment, the stratified film 100 contains less than 1 wt % crystallizing agent. The crystallizing agent may contain tellurium (Te), silicon (Si), boron (B), zinc (Zn), or oxides thereof. In an exemplary embodiment, the stratified layer 100 contains less than 1 wt % or less than 0.1 wt % tellurium. The crystallites in the LowT$_M$BM sublayer may increase the internal strength of the sublayer 120, acting as a support structure. Aluminum-based materials may also be included in Ag:LowT$_M$BM films to reduce contact resistance in overlap regions on the back side of a solar cell, which be described in more detail below. In an exemplary embodiment, the stratified film contains at least 0.5 wt % aluminum.

The contact resistance between the LowT$_M$BM sublayer 120 and the silicon substrate 110 is greater than 100 mΩ-cm$^2$, greater than 1 Ω-cm$^2$, or greater than 10 Ω-cm$^2$.

In some embodiments, there is a passivation layer (not shown), such as a silicon nitride (Si$_3$N$_4$) layer between the silicon substrate 110 and the stratified film 100. Such a passivation layer lowers the surface recombination velocity at the interface between the silicon substrate 110 and the stratified film 100. The stratified film 100 is in contact with the passivation layer instead of directly contacting the surface of the silicon substrate 110. Pastes that do not etch through the dielectric layer is known as a "floating" metallization pastes. Floating metallization pastes can be made by careful selection of crystallizing agents and LowT$_M$BMs. The degree to which the paste etches through the Si$_3$N$_4$ can be measured by first co-firing the paste on a Si$_3$N$_4$ coated silicon wafer followed by etching the silver film in an appropriate strong acid based etchant and measuring the area removed under the metallization layer using an optical microscope. Silicon nitride sections that are not etched remain blue while etched regions show exposed silicon. When more than 90% of the metallized area contain the Si$_3$N$_4$ after etching, a paste can be considered to be a floating metallization paste. For floating busbar pastes it is advantageous to use non-fire through pastes so that penetration of the passivation layer does not occur. In other exemplary embodiments, the Ag:LowT$_M$BM metallization paste is a floating paste.

Solar Cell Fabrication Using Ag:LowT$_M$BM Based Rear Tabbing Pastes

Figure 2:
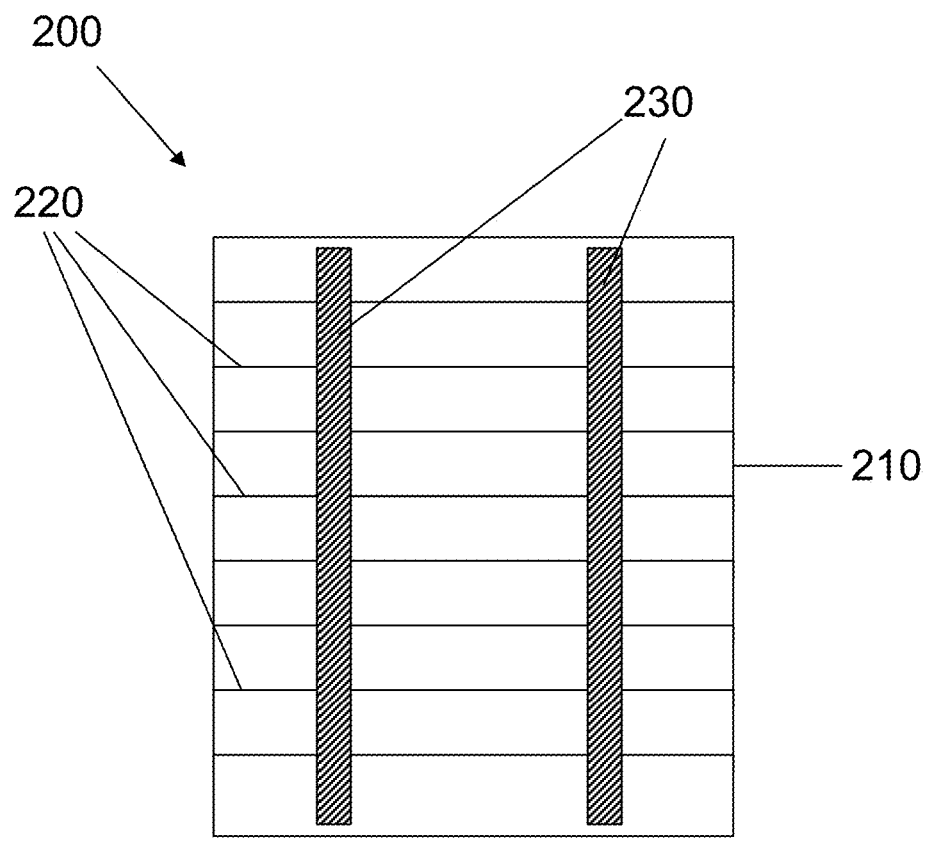
FIG. 2 is a schematic drawing that shows the front (or illuminated) side of a silicon solar cell, according to an embodiment of the invention.

FIG. 2 is a schematic drawing that shows the front (or illuminated) side of a silicon solar cell 200. The silicon solar cell 200 has a silicon wafer 210 with an anti-reflective coating (not shown), and in some cases, a dielectric layer (not shown) on the back side. In various embodiments, the silicon wafer is monocrystalline, or multi-crystalline, and has an n-type, or a p-type base. The solar cell has fine grid lines 220 and front side bus bars lines 230. In one embodiment, Ag:LowT$_M$BM metallization pastes are used as drop-in replacements for commercial Ag-based pastes to form the front side bus bars lines 230. First, a commercially-available front-side metallization paste is screen printed and dried at 150° C. to form the fine grid lines 220. Then, the Ag:LowT$_M$BM metallization paste is screen printed and dried at 150° C. to form the front busbar layers 230. In one embodiment, the front busbars do not penetrate through the anti-reflective coating. The rear tabbing paste and rear aluminum paste are subsequently printed and dried, and the entire wafer is co-fired to over 750° C. for approximately one second in air. In one arrangement, screen-printed front busbar layers 230 range in thickness from about 2 to 15 μm after co-firing. The front busbar layers 230 have a bulk conductivity that is 2-50 times, or 2-25 times, or 2-10 times less than the bulk conductivity of silver, which has a bulk resistivity of about 1.6E−8 Ω-m.

Figure 3:
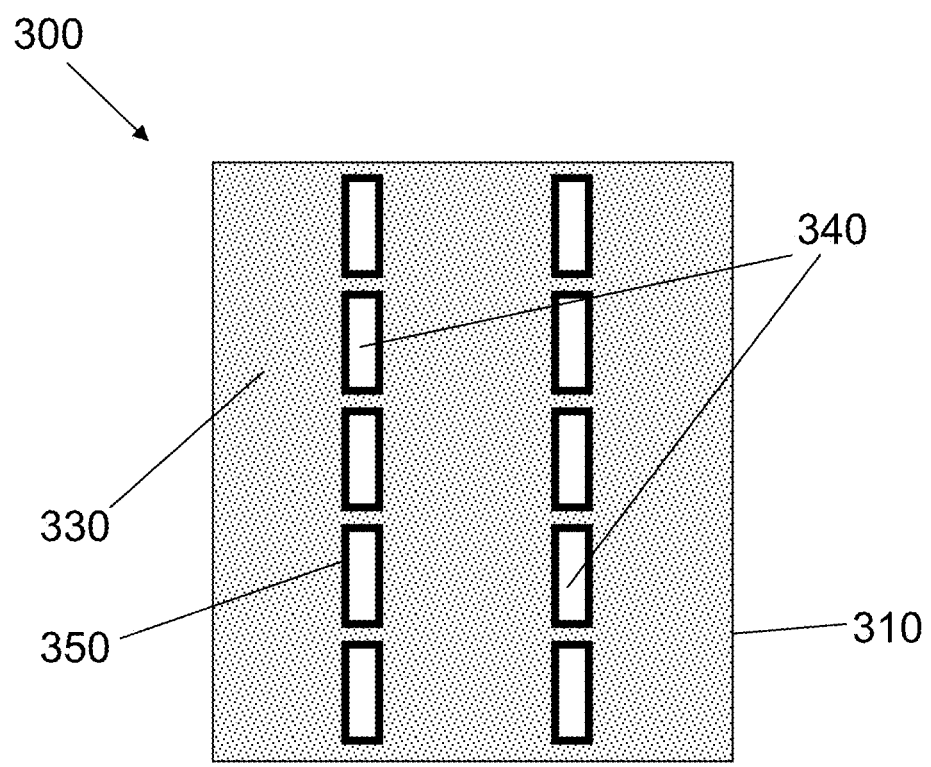
FIG. 3 is a schematic drawing that shows the rear side of a silicon solar cell, according to an embodiment of the invention.

FIG. 3 is a schematic drawing that shows the rear (or back) side of a silicon solar cell 300. Some regions of the rear side of the solar cell are coated with an aluminum layer 330 and some regions are coated with has rear side tabbing layers 340 distributed over a silicon wafer 310. In some embodiments, the aluminum layer 330 extends over a portion of the rear tabbing layers 340 creating overlap regions 350. In one embodiment, Ag:LowT$_M$BM metallization pastes are used as drop-in replacements for commercial Ag-based metallization pastes to form the rear tabbing layers 340. The Ag:LowT$_M$BM rear tabbing paste is screen printed onto portions of the silicon wafer 310 and dried at 150° C. to form the rear tabbing layer 340. An aluminum paste is subsequently printed onto the remaining portions of silicon substrate 310 that have not already been printed with the Ag:LowT$_M$BM rear tabbing paste to form the aluminum layer 330. A portion of the aluminum layer 330 overlaps a portion of the rear tabbing layers 340 in the overlap regions 350. The solar wafer is subsequently dried at 250° C. for 30 seconds to 10 minutes. Prior to co-firing, the overlap region 350 contain a layer of dried Ag:LowT$_M$BM paste on the silicon surface and a dried aluminum layer over the layer of dried Ag:LowT$_M$BM paste. A commercially-available front side metallization paste is screen printed and dried at 150° C. to form the fine grid lines 220 and busbar 230 layers (FIG. 2). Then the silicon solar cell is co-fired at over 750° C. for approximately one second, which is a common temperature profile for aluminum BSF silicon solar cells. During co-firing it is common for the regions of the aluminum layer 330 that are in direct contact with the silicon wafer to form both a back surface field and a solidified aluminum-silicon eutectic layer. After co-firing the overlap region 350 contains a solid aluminum-silicon eutectic layer on the silicon wafer 310, a modified rear tabbing layer on the solid aluminum-silicon eutectic layer and an aluminum layer over the modified rear tabbing layer. In one arrangement, screen-printed rear tabbing layers range in thickness between about 1.5 and 7 μm after co-firing. The rear tabbing layer has a bulk conductivity that is 2-50 times, 2-25 times, or 2-10 times less conductive than bulk silver, which has a bulk resistivity of about 1.6E−8 Ω-m.

In another embodiment, the rear surface of the silicon substrate has a dielectric layer, and the rear tabbing layers do not penetrate through the dielectric layer. In another embodiment, the rear surface of the silicon substrate has a doped silicon base layer, and the rear tabbing layers make electrical contact to the silicon base layer with a contact resistance greater than 100 mΩ-cm$^2$.

In some embodiments silicon solar cells are connected to one another by soldering tin-coated copper tabbing ribbons to the front busbars and rear tabbing layers. Solder fluxes that are commercially designated as either RMA (e.g., Kester® 186) or R (e.g., Kester® 952) are deposited on the tabbing ribbon and dried at 70° C. A tinned copper ribbon, which is between 0.8 and 3 mm wide and 100-300 um thick, is then placed on the solar cell and contacted to the front busbars and the rear tabbing layers with a solder iron at a temperature between 200° and 400° C. The solder joints formed during this process have a mean peel strength that is greater than 1 N/mm (e.g., a 2 mm tabbing ribbon would require a peel force of greater than 2N to dislodge the tabbing ribbon).

Silver Paste Containing LowT$_M$BMs and Crystallizing Agent to Improve Peel Strength In the past, routine optimization of conventional glass frit concentrations could not achieve optimal morphologies in Ag-LowT$_M$BM metallization pastes. Adjusting the proportion of conventional frits that are used in solar metallization pastes within the ranges that have been used in the past (i.e., 3-8 wt %) produced only weak films even at the lowest frit loadings. The most commonly used frits are bismuth-based or lead-based, which can be strongly glass-forming and can cause amorphization of the LowT$_M$BM layer. Because the glassy phase formed from frit has typically been considered to be a source of internal strength and adhesion to the silicon substrate, it would have been counterintuitive to attempt to crystallize the glassy phase of a composite film formed under specific ratios of Ag, Bi, and weak glass-forming frits, especially in the absence of the crystalline phases.

Table II below shows the compositions of several pastes that were screen printed as busbars and tabbing layers on a silicon substrate, dried, and co-fired over a range of firing conditions typically used for conventional Al BSF (aluminum back surface field), multicrystalline solar cells. Each substrate with paste was placed on a mat, heated to 65° C., and soldered with a tip temperature of 285° C. using a copper ribbon with Sn$_{60}$Pb$_{40}$ solder that was fluxed with Alpha® NR-205 and dried at 70° C. The metal lines were subsequently peeled at 180° over a distance greater than 60 mm. Peel strengths averaged over several co-firing conditions for each paste are also shown in Table I. The data shows clearly the importance of including a crystallizing agent and minimizing strong glass-forming frits in the Ag:LowT$_M$BMs system in order to maximize peel strength.

TABLE II

Silver/LowT$_M$BMs/Crystallizing Agent Metallization Paste Formulations (wt %)

| Paste | Silver particles | LowT$_M$BM particles | Crystallizing Agent | Strong Glass-Forming Frit | Organic Vehicle | Average Peel Strength |
|---|---|---|---|---|---|---|
| Paste A | 35 | 20 | 0 | 0 | 45 | 2.4 N/mm |
| Paste B | 35 | 20 | 1 | 0 | 44 | 4.3 N/mm |
| Paste C | 35 | 20 | 0 | 1 | 44 | 1.8 N/mm |

Paste A is a control paste that contains 35 wt % Ag particles, 20 wt % metallic Bi particles as the LowT$_M$BM particles, and no crystallizing agent or glass frit. Paste A has an average peel strength of 2.4 N/mm. Peel strength for films made from Paste A drop below 2 N/mm when co-fired at lower temperatures typically used for passivated emitter rear contact (PERC) solar cell architectures.

Paste B contains 35 wt % Ag particles, 20 wt % of metallic Bi particles as the LowT$_M$BMs, 1 wt % tellurium oxide frit, which acts as the crystallizing agent, and no strong glass-forming frits (i.e., no Bi$_2$O$_3$ or PbO containing frit), according to an embodiment of the invention. Adding only 1 wt % crystallizing agent increases the average peel strength of the film to 4.3 N/mm, and these values are consistently high over a range of firing temperatures greater than 100° C. The viscosity of Paste B is approximately 80,000 cP at 25° C. and at a sheer rate of 4 sec$^{-1}$.

Traditionally, glass frits used in Ag metallization pastes have been made from Bi and Pb oxide derivatives, which are strong glass-forming frits. These strong glass-forming frits do not make strong films when large concentrations of LowT$_M$BMs such as Bi are also included in the paste. Traditional frits can aid in the oxidation of Bi and result in films that have very poor solderability. Paste C, shown in Table I, contains 35 wt % Ag particles, 20 wt % of metallic Bi particles as the LowT$_M$BMs and 1 wt % of Bi$_2$O$_3$ containing frit. The average peel strength for films made from Paste C is 1.8 N/mm, which is significantly lower than the peel strength of Paste B which contains the crystallizing agent.

Figure 4:
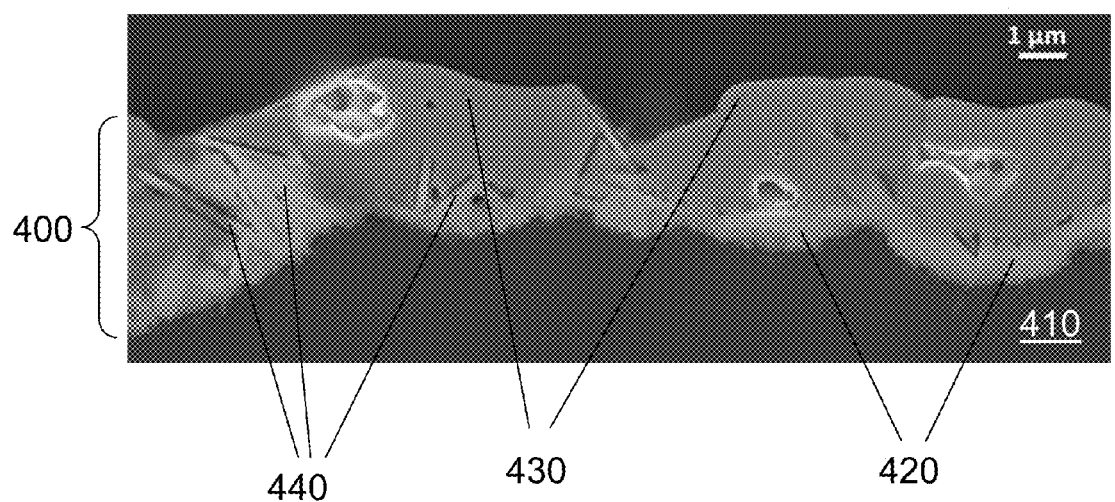
FIG. 4 is a scanning electron microscope (SEM) image (10 k× magnification) of a stratified Ag:Bi film on a silicon wafer, according to an embodiment of the invention.

FIG. 4 is a scanning electron microscope (SEM) image that shows a polished cross section of a stratified metal film 400 on a silicon substrate 410 made from Paste B. The image shows a LowT$_M$BM sublayer 420 adjacent to the silicon substrate 410. The LowT$_M$BM sublayer 420 is approximately 1 μm-thick and contains mainly bismuth, oxygen and silicon. The bright regions in the LowT$_M$BM sublayer 420 are crystallites 440 that have been identified as bismuth silicates. There is a silver-rich sublayer 430 that is approximately 1-2 μm-thick over the LowT$_M$BM sublayer 420. Many of the crystallites 440 extend from the silicon substrate 410 into the silver-rich sublayer 430. In one embodiment, the normalized weight ratio of silver to bismuth (Ag:Bi) in the stratified metal film 400 is 1.8 to 1, resulting in a low-melting-point base-metal fraction of 35.7 wt % (1/(1.8+1)). The crystallizing agent in Paste B, which contains tellurium, represents less than 1 wt % of the stratified film.

X-ray diffraction was performed using a Bruker ZXS D8 Discover GADDS x-ray diffractometer equipped with a VÅNTEC-500 area detector and a cobalt x-ray source operated at 35 kV and 40 mA. Diffractograms were measured using the cobalt Kα wavelength in two 25° frames which were combined for a total window of 25-60° in 2Θ.

Figure 5:
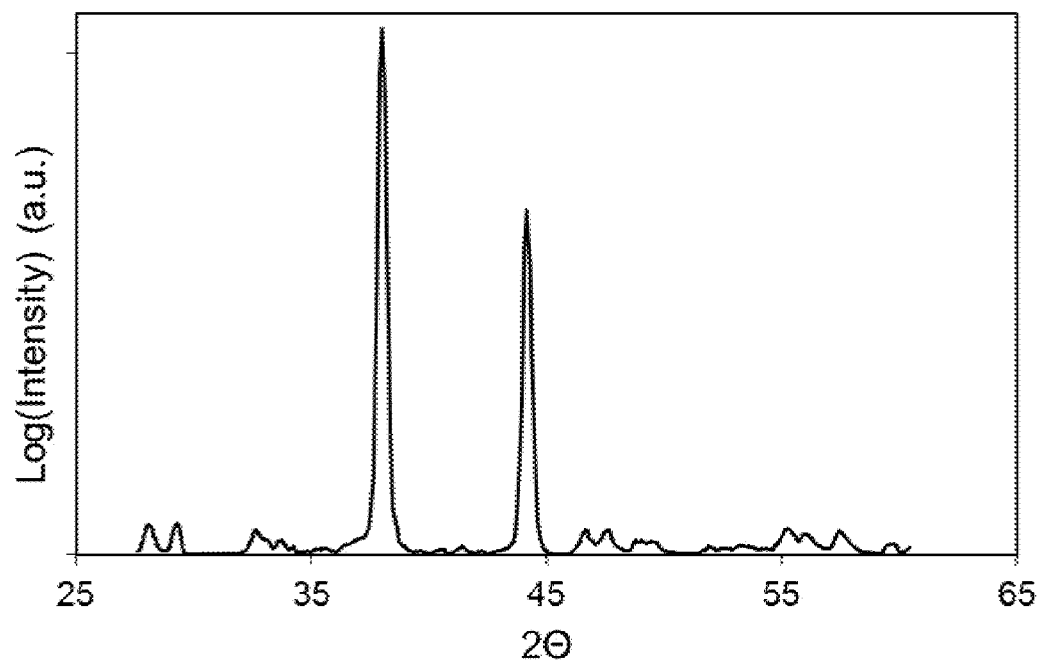
FIG. 5 is an x-ray diffraction (XRD) pattern from a stratified Ag:Bi film on a silicon substrate, according to an embodiment of the invention.

Each frame was measured for 30 minutes under x-ray irradiation. Background subtraction was performed on diffraction patterns. FIG. 5 is an x-ray diffraction (XRD) pattern of the stratified Ag:Bi film made from Paste B and shown in FIG. 4. The small peaks in the pattern have been identified as crystalline bismuth silicates. There are two families of crystallites in the stratified Ag:Bi film made from Paste B and shown in FIG. 4. They have been identified using XRD and EDX. Crystallites formed by the interaction of the bismuth and silicon in the presence of the crystallizing agent were found to be (Bi$_2$O$_3$)$_x$(SiO$_2$) (1≤x≤6); exemplary crystallites contained the crystalline phases (Bi$_2$O$_3$)(SiO$_2$), (Bi$_2$O$_3$)$_6$(SiO$_2$), and (Bi$_2$O$_3$).

In one embodiment, the silver particles in the paste alloy with the bismuth silicate material to form crystalline and glassy compounds such as Ag$_y$(Bi$_2$O$_3$)$_x$(SiO$_2$)$_{1-y-x}$ (0.1≤x≤0.9, 0≤y≤0.9), which can be seen with EDX on metallization layers after they have been soldered and peeled.

The bulk resistivity of the Ag/LowT$_M$BM film resulting from Paste B was determined to be 6E-6 ohm-cm, measured using the four-point probe measurement. The bulk resistivity of Ag/LowT$_M$BM films is higher than the bulk resistivity of pure Ag (1.6E-6 ohm-cm), which is to be expected as roughly one third of the Ag/LowT$_M$BM film contains a LowT$_M$BMs layer that is less conductive than Ag. However, the bulk resistivity of the Ag/LowT$_M$BM film is close to the values of rear tabbing layers measured on commercially available PV cells. Thus, even though the bulk resistivity of such novel films is less than for silver-only films, the novel films have low enough resistivity to make them useful for various solar cell metallization applications.

With reference to FIG. 1, although the LowT$_M$BM layer 120 along the silicon substrate 100 does not greatly impede the flow of current parallel to the surface of the silicon substrate, the LowT$_M$BM layer may decrease the flow of current from the silicon substrate 110 to the Ag sublayer 130. Such a stratified Ag:LowT$_M$BM layer on the front side of a solar cell (i.e., n-type emitter layer/silicon nitride) has a contact resistance of more than 10 Ω-cm$^2$ when measured using TLM. It should be noted that the contact resistance of commercially available front side pastes are at least two orders of magnitude lower when measured under the same conditions. Tellurium oxide based frits have previously been used in fine grid line pastes to reduce contact resistance. However, when LowT$_M$BM represents more than 20 wt % versus the silver, the tellurium oxide based frit does not greatly improve the contact resistance. The advantage of using tellurium oxide based crystallizing agent in our system may not be related to improving Ag crystallite formation at the Si interface. Rather the tellurium oxide based crystallizing agent can, work to crystallize the LowT$_M$BMs layer between the Ag metallization layer 130 and silicon substrate 110, further separating the Ag from the silicon and may even impede Ag crystallite formation at the silicon interface, which is necessary for low contact resistance.

Figure 6A:
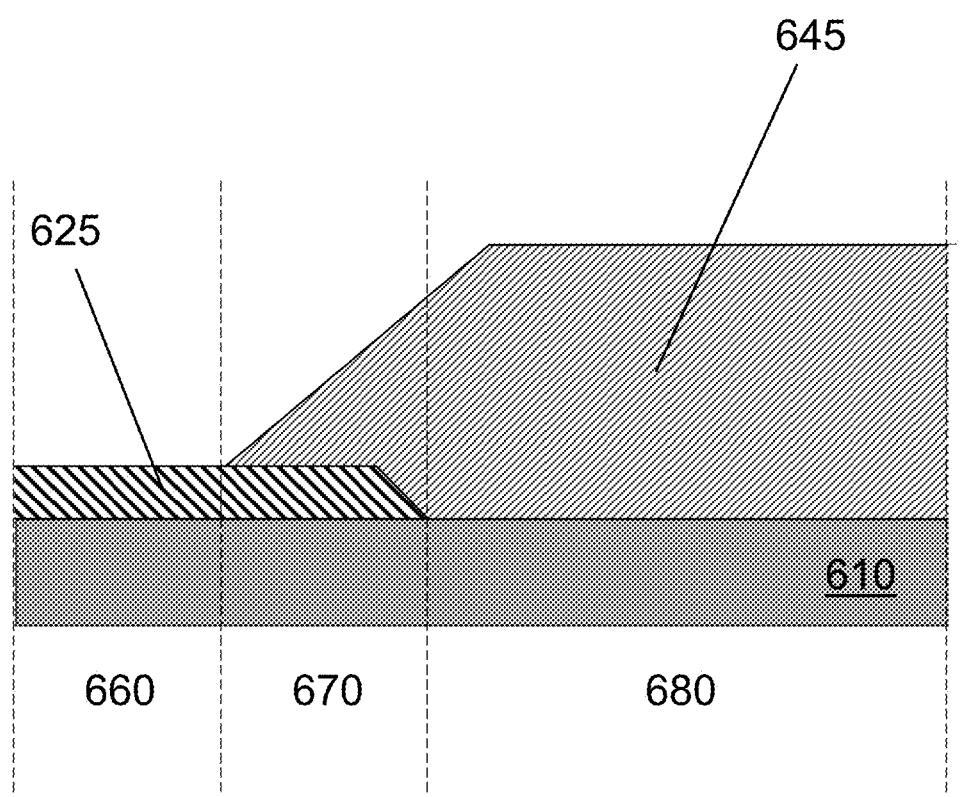
FIG. 6A is a cross-section schematic illustration that shows a portion of the rear side of a silicon solar cell before co-firing, according to an embodiment of the invention.

Silver Paste Containing Aluminum-Based Particles to Reduce Contact Resistance Between the Metallization Layer and the Aluminum Layer One of the greatest challenges in increasing the amount of LowT$_M$BMs in metallization pastes is the possibility of high contact resistance between a rear tabbing layer and an aluminum layer. FIG. 6A is a cross-section schematic illustration that shows a portion of the rear side of a silicon solar cell before co-firing, according to an embodiment of the invention. FIG. 6A includes a rear tabbing region 660, an overlap region 670, and an aluminum layer region 680, as indicated by dashed lines. In the rear tabbing region 660 and the overlap region 670 a silicon substrate 610 is coated with a Ag:LowT$_M$BM rear tabbing paste layer 625. In the aluminum layer region 680, the silicon substrate 610 is coated with an aluminum layer 645. In one arrangement, the structures in the overlap region 670 are created by printing the rear tabbing paste layer 625 directly onto the silicon wafer 610, drying the rear tabbing paste layer 625, and then printing the aluminum layer 645 over the rear tabbing paste layer 625. In some embodiments, the overlap region has a width between 10 μm and 500 μm, between 100 μm and 300 μm wide, or any range subsumed therein. In another embodiment of the invention (not shown), the structures in the overlap region 670 are created in reverse order by printing the aluminum layer 645 directly onto the silicon wafer 610, drying the aluminum layer 645, and then printing the rear tabbing paste layer 625 over the aluminum layer 645.

Figure 6B:
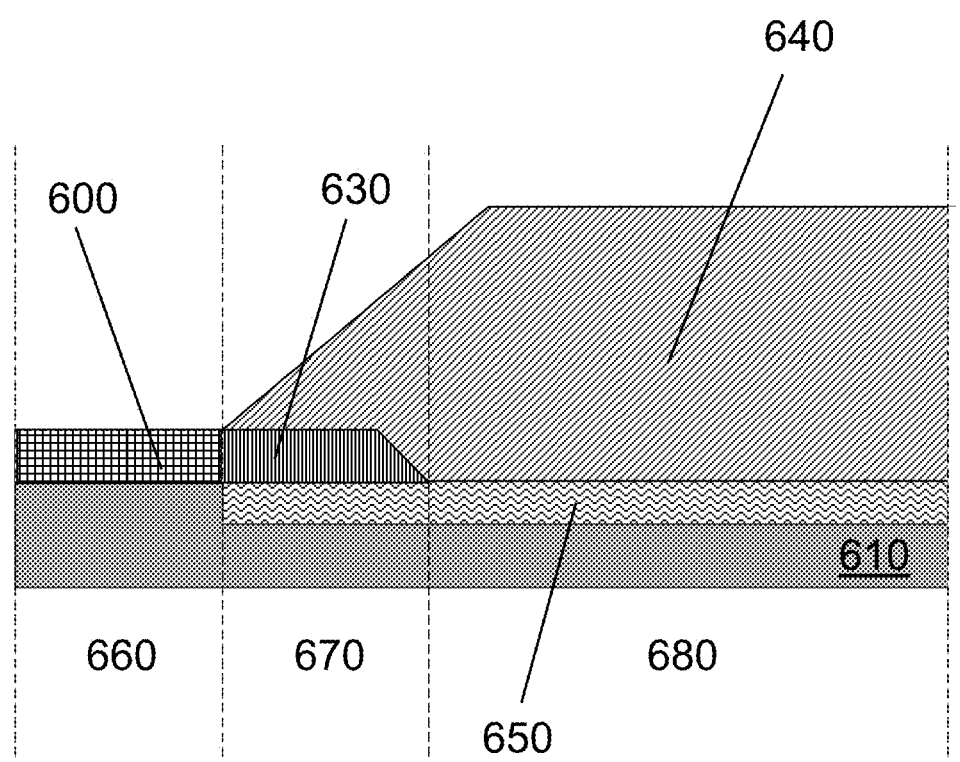
FIG. 6B is a cross-section schematic illustration that shows a portion of the rear side of the silicon solar cell shown in FIG. 6A after co-firing, according to an embodiment of the invention.

FIG. 6B is a cross-section schematic illustration that shows a portion of the rear side of the silicon solar cell shown in FIG. 6A after co-firing. FIG. 6B includes the same rear tabbing region 660, overlap region 670, and aluminum layer region 680 that are shown in FIG. 6A. During co-firing, various reactions occur. In the rear tabbing region 660 the exposed portion 627 of the Ag:LowT$_M$BM rear tabbing paste layer 625 has reacted to form a stratified layer 600 that includes an Ag-rich sublayer and a LowT$_M$BM sublayer, as has been described above in reference to FIG. 1.

In the aluminum layer region 680 the aluminum film 640 interacts with the silicon wafer 610 (at temperatures above 660° C.) to form a solid aluminum-silicon eutectic layer 650. In one arrangement, there is a solid aluminum-silicon eutectic layer 650 in both the aluminum layer region 680 and the overlap region 670, as shown in FIG. 6B. In one arrangement, the solid aluminum silicon layer 650 is continuous. In another arrangement, the solid aluminum silicon layer 650 is not continuous. Aluminum is a p-type dopant in silicon and, during firing, it can also form a highly p-type doped region that is known as the back surface field (not shown).

In the overlap region 670 aluminum from the aluminum layer 640 and silver from the covered portion 623 of the rear tabbing paste layer 625 have interdiffused, forming a modified rear tabbing layer 630. The solid aluminum-silicon eutectic layer 650 may or may not form in the overlap region 670. For a rear tabbing paste layer 625 that contains more than 90 wt % silver, the Ag—Al interdiffusion can result in the formation of a solid aluminum-silicon eutectic layer 650 in the overlap region 670. Such a solid aluminum-silicon eutectic layer in the overlap region 670 may play a key role in reducing contact resistance between the modified tabbing layer 630 and the aluminum layer 640. For example, pure Ag rear tabbing pastes with less than 10 wt % glass frit typically form layers that have a contact resistance less than 3 mΩ between the rear tabbing and aluminum layers. For a rear tabbing paste layer 625 in which a significant portion of silver particles have been replaced by LowT$_M$BMs, very little Ag—Al interdiffusion may occur and there may be little or no formation of a solid aluminum-silicon eutectic layer in the overlap region 670. High loadings of LowT$_M$BMs in rear tabbing pastes may form layers that have extremely high contact resistance (i.e., more than 10 mΩ) between the rear tabbing and aluminum layers. During co-firing most of the silver may interdiffuse into the aluminum layer 640 leaving a modified rear tabbing layer 630 made of porous LowT$_M$BM material and little or no solid aluminum-silicon eutectic layer 650. Silicon solar cells that have overlap regions 670 that contain porous modified tabbing layers 630 and no solid aluminum-silicon eutectic may have high overall series resistance.

Aluminum and silver may interdiffuse during co-firing. In one arrangement, such interdiffusion result in a silver-aluminum region (not shown) that can extend by as much as 100 μm from the aluminum layer 640 into the rear tabbing region 660.

Figure 7:
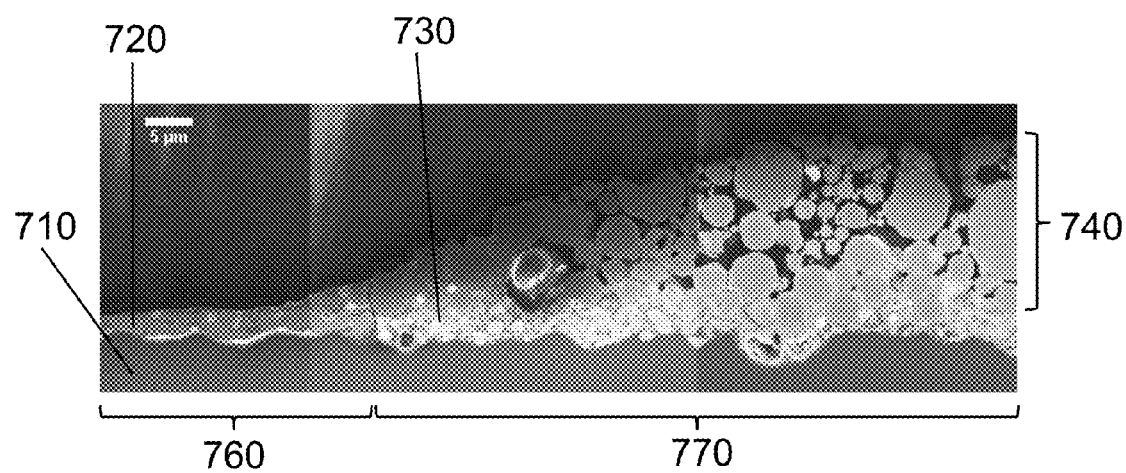
FIG. 7 is a scanning electron microscope (SEM) image (3 k× magnification) of an overlap region on the silicon solar cell wherein the rear tabbing layer does not contain aluminum-based particles.

In one embodiment of the invention, the backside of a solar cell has an overlapping region that contains an aluminum layer and a rear tabbing layer made from a Ag:LowT$_M$BM paste that does not contain aluminum-based particles. The low-melting-point base-metal (bismuth) fraction in the paste is greater than 20 wt %. A polished, cross-section sample of the overlapping region was prepared for SEM imaging. An InLens mode scanning electron micrograph of the sample is shown FIG. 7. The rear tabbing region 760, the overlap region 770, and the silicon substrate 710 are indicated. The aluminum layer 740 is about 15 μm thick and the LowT$_M$BM-containing rear tabbing layer 720 is about 2.5 μm thick. The overlap region 770 contains a relatively porous modified rear tabbing layer 730 and does not have a solid Al—Si eutectic layer. The contact resistance between the rear tabbing and aluminum layer for this sample is greater than 10 mΩ. overlap region.

Adding aluminum-based particles to the Ag:LowT$_M$BM stratified film can reduce the contact resistance between the silver-based rear tabbing layer and the aluminum. In an exemplary embodiment, the aluminum-based particles in the Ag:LowT$_M$BM film assist in the formation of the aluminum-silicon eutectic formation during co-firing resulting in a solid Al—Si eutectic layer.

Figure 8:
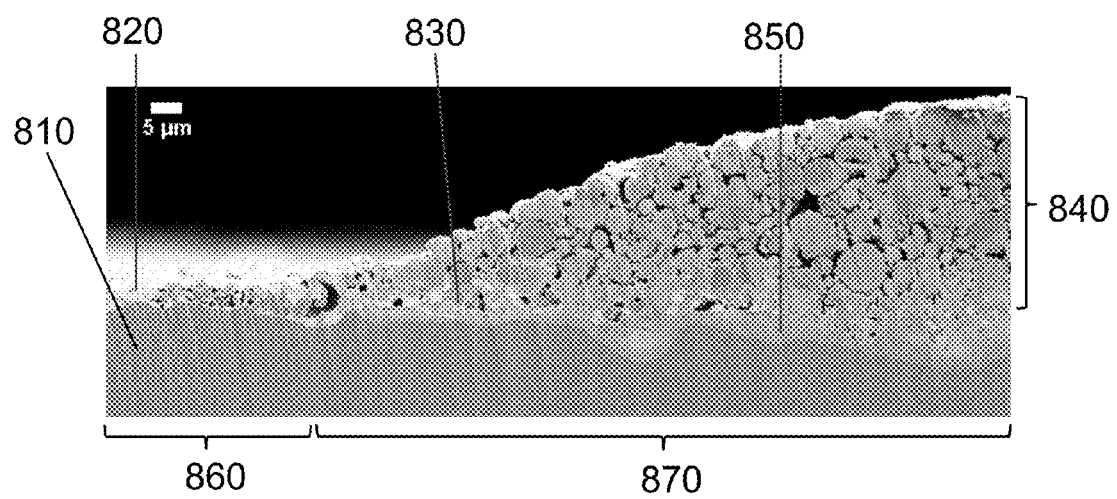
FIG. 8 is a scanning electron microscope (SEM) image (3 k× magnification) of an overlap region on the silicon solar cell wherein the rear tabbing layer contains aluminum based particles, according to an embodiment of the invention.

In another embodiment of the invention, the backside of a solar cell has an overlapping region that contains an aluminum layer and a rear tabbing layer made from a Ag:LowT$_M$BM paste that contains aluminum-based particles. The low-melting-point base-metal (bismuth) fraction in the paste is greater than 20 wt %. A polished, cross-section sample of the overlapping region was prepared for SEM imaging. An InLens mode scanning electron micrograph of the overlap region 870 is shown FIG. 8. The rear tabbing region 860, the overlap region 870, and the silicon substrate 810 are indicated. The aluminum layer 840 is about 20 μm thick and the LowT$_M$BM-containing rear tabbing layer 820 is about 2 μm thick. The overlap region 870 contains a modified rear tabbing layer 830 that appears to be non-porous, as well as a solid Al—Si eutectic layer 850. The contact resistance between the rear tabbing and aluminum layer for this sample is less than 1.5 mΩ, which is similar to the contact resistance for silver rear tabbing pastes that contain no LowT$_M$BM. In various embodiments, the modified rear tabbing layer 830 contains at least 1 wt % Al, at least 2 wt %, or at least 4 wt % aluminum. In various embodiments, the rear tabbing layer 820 contains at least 1 wt % Al, at least 2 wt %, or at least 4 wt % aluminum.

Other PV Cell Architectures

Ag:LowT$_M$BM based pastes can be used in other Si PV architectures such as metal wrap through as well as passivated emitter rear contact (PERC) solar cells. The Ag:LowT$_M$BM based paste, described herein, can be used as a drop-in replacement for any metallization layers where a low contact resistance to silicon is not required. For the PERC architecture the LowT$_M$BMs and crystallizing agents can be modified to initiate crystallization at lower co-firing temperatures. In some instances, strong forming-glass frits may be used to initiate crystallization at low firing temperatures.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. A metallization paste comprising:
   a plurality of silver particles;
   a plurality of low-melting-point, base-metal particles;
   a plurality of aluminum-based particles;
   wherein the silver particles, the low-melting-point base-metal particles, and the aluminum-based particles, are mixed together in an organic vehicle; and
   wherein the metallization paste contains a low temperature base-metal fraction greater than 20%; and
   wherein the metallization paste has a viscosity between 10,000 and 200,000 cP at 25° C. and at a sheer rate of 4 sec$^{-1}$.

2. The metallization paste of claim 1, wherein the metallization paste has a solids loading between 30 wt % and 70 wt %.

3. The metallization paste of claim 1, wherein the metallization paste comprises between 10 wt % and 45 wt % silver particles.

4. The metallization paste of claim 1, wherein the metallization paste comprises between 5 wt % and 35 wt % low-melting-point, base-metal particles.

5. The metallization paste of claim 1, wherein the metallization paste comprises between 0.5 wt % and 3 wt % aluminum-based particles.

6. The metallization paste of claim 1, wherein the silver particles are spherically shaped nanoparticles with a D50 between 10 nm and 1 μm.

7. The metallization paste of claim 1, wherein the silver particles are spherically shaped micron-sized particles with a D50 between 1 μm and 10 μm.

8. The metallization paste of claim 1, wherein the low-melting-point, base-metal particles are made of a material selected from the group consisting of bismuth (Bi), tin (Sn), tellurium (Te), antimony (Sb), lead (Pb), or alloys, composites, or other combinations thereof.

9. The metallization paste of claim 1, wherein the low-melting-point, base-metal particles comprise bismuth.

10. The metallization paste of claim 1, wherein the low-melting-point, base-metal particles have a spherical shape with a D50 between 50 nm and 5 μm.

11. The metallization paste of claim 10, wherein the low-melting-point, base-metal particles comprise bismuth cores wherein each bismuth core is coated by a silver shell and the silver shell is less than 200 nm thick.

12. The metallization paste of claim 1, wherein the aluminum-based particles have a spherical shape with a D50 between 50 nm and 15 μm.

13. The metallization paste of claim 1 further comprising a crystallizing agent mixed together with the silver particles, the low-melting-point base-metal particles, and the aluminum-based particles in the organic vehicle.

14. The metallization paste of claim 13, wherein the crystallizing agent comprise less than 1 wt % of the metallization paste.

15. The metallization paste of claim 13, wherein the crystallizing agent comprises a material selected from the group consisting of tellurium, silicon, boron, zinc, and oxides and alloys thereof.

* * * * *